United States Patent
Lin et al.

(10) Patent No.: US 8,728,894 B2
(45) Date of Patent: May 20, 2014

(54) METHOD FOR FABRICATING AN NMOS TRANSISTOR

(75) Inventors: Yangkui Lin, Shanghai (CN); Zhihao Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/171,426

(22) Filed: Jun. 28, 2011

(65) Prior Publication Data

US 2012/0214286 A1     Aug. 23, 2012

(30) Foreign Application Priority Data

Feb. 21, 2011   (CN) .......................... 2011 1 0041936

(51) Int. Cl.
*H01L 21/336* (2006.01)

(52) U.S. Cl.
USPC .................... 438/289; 438/530; 257/E21.466

(58) Field of Classification Search
USPC .................. 438/290, 239, 293; 257/E21.317, 257/E21.4, E21.466, E21.471
See application file for complete search history.

(56) References Cited

U.S. PATENT DOCUMENTS

| 6,667,199 | B2 * | 12/2003 | Torii et al. ...................... 438/183 |
| 7,795,101 | B2 | 9/2010 | Wang et al. |
| 7,875,521 | B2 | 1/2011 | Shimamune et al. |
| 2002/0168828 | A1 * | 11/2002 | Cheng et al. .................. 438/303 |
| 2004/0228172 | A1 * | 11/2004 | Rinerson et al. ............... 365/158 |
| 2005/0153528 | A1 * | 7/2005 | Oyu et al. ...................... 438/516 |
| 2006/0261441 | A1 * | 11/2006 | Marsh et al. ................... 257/532 |
| 2007/0246781 | A1 * | 10/2007 | Tsuchiaki ...................... 257/369 |
| 2009/0221117 | A1 * | 9/2009 | Tan et al. ....................... 438/238 |

* cited by examiner

*Primary Examiner* — Cheung Lee
(74) *Attorney, Agent, or Firm* — Anova Law Group, PLLC

(57) ABSTRACT

A method for fabricating an NMOS transistor includes providing a substrate; forming a gate dielectric layer structure on the substrate and forming a gate electrode on the gate dielectric layer structure. The method further includes performing a fluorine ion implantation below the gate dielectric layer and an annealing process in an atmosphere comprising hydrogen or hydrogen plasma. The method also includes forming a source region and a drain region on both sides of the gate electrode before or after the fluorine ion implantation.

18 Claims, 4 Drawing Sheets

METHOD FOR FABRICATING AN NMOS TRANSISTOR

CROSS-REFERENCES TO RELATED APPLICATIONS

This application claims priority under 35 USC §119 of Chinese Patent Application No. 201110041936.5, filed Feb. 21, 2011, commonly assigned and incorporated herein by reference in its entirety.

BACKGROUND OF THE INVENTION

The present invention is related to semiconductor technology, and particularly to NMOS transistors.

The minimum feature sizes of integrated circuit have been shrinking for years. The gate length of an MOS transistor has been decreased, and the source/drain regions and the source/drain extension regions are made shallower accordingly. In the current semiconductor technology, the depth of the source/drain regions of a semiconductor device can be less than 1000 Å.

In order to fabricate source/drain regions with reduced depth, the thermal budget should be reduced; that is to say, a lower heat treatment temperature and shorter heat treatment time are needed, which may lead to hot carrier injection (HCI) problems. The HCI refers to a high speed motion of carriers in the channel region (in the NMOS transistor, electrons are the majority carriers in the channel region) accelerated by a strong electric field into the gate dielectric layer, which causes the threshold voltage to drift and leads to lower current and degrades the operating frequency of an integrated circuit. The presence of such mobile carriers can drastically change device characteristics over prolonged periods. The accumulation of damage can eventually cause the circuit to fail as device parameters (e.g., threshold voltage) shift due to such damage. The useful life-time of integrated circuits is then affected by the life-time of an NMOS transistor itself.

In the conventional art, in order to reduce the HCI problem, a lightly doped drain (LDD) ion implantation process is adopted. Specifically, by reducing the dose of the LDD ion implantation and increasing the LDD implantation energy, a deeper LDD junction can be obtained and the strength of the transverse electric field can be reduced, thus, reducing the HCI problem. For example, methods for reducing HCI are disclosed in U.S. Pat. No. 7,795,101 and U.S. Pat. No. 7,875,521. Therefore, there is a need for methods and techniques to reduce HCI problems.

BRIEF SUMMARY OF THE INVENTION

Embodiments of the present invention provide a method for fabricating an NMOS and solving problems of hot carrier injection and thereby increasing life time of NMOS transistors.

In one embodiment, a method for fabricating an NMOS transistor includes providing a semiconductor substrate, forming a gate dielectric layer on the semiconductor substrate and forming a gate electrode on the gate dielectric layer. The method further includes performing a fluorine ion implantation in the semiconductor substrate below the gate dielectric layer, and an annealing process after the fluorine ion implantation in an atmosphere comprising hydrogen or hydrogen plasma.

In an embodiment of the method described above, the energy of the fluorine ion implantation ranges from about 2 KeV to about 20 KeV. In another embodiment, the dosage of the fluorine ion implantation ranges from about 1E14 atom/cm$^2$ to about 3E15 atom/cm$^2$.

In one embodiment, the method includes forming a source region on a first side of the gate electrode and a drain region on a second side of the gate electrode, the source and drain regions may be formed either before or after the fluorine ion implantation.

In an embodiment of the method described above, forming the source and drain regions in the semiconductor substrate on both sides of the gate electrode includes performing a first ion implantation in the semiconductor substrate using the gate electrode as a mask to form a source extension region and a drain extension region, forming spacers on sidewalls of the gate dielectric layer and the gate electrode, and performing a second ion implantation in the semiconductor substrate using the spacers and the gate electrode as a mask to form the source and drain regions.

In some embodiments, the fluorine ion implantation can be performed before the first ion implantation.

In another embodiment, the fluorine ion implantation can be performed after the first ion implantation and before forming the spacers. In yet another embodiment, the fluorine ion implantation can be performed after forming the spacers and before the second ion implantation. In another embodiment, the fluorine ion implantation can be performed after the second ion implantation.

In another embodiment, the method performs a first activation annealing process in the semiconductor substrate after the first ion implantation to activate implanted ions. In another embodiment, the method performs a second activation annealing process in the semiconductor substrate after the second ion implantation to activate implanted ions.

In another embodiment, the temperature of the annealing process ranges from about 350° C. to 550° C., and the time period of the annealing process ranges from about 20 minutes to about 60 minutes.

In another embodiment, the atmosphere of the annealing process can be a mixture of hydrogen and nitrogen, a mixture of hydrogen and argon, a mixture of hydrogen and helium, a mixture of hydrogen, nitrogen and argon, a mixture of hydrogen, nitrogen and helium, a mixture of hydrogen plasma and nitrogen, a mixture of hydrogen plasma and argon, a mixture of hydrogen plasma and helium, a mixture of hydrogen plasma, nitrogen and argon, or a mixture of hydrogen plasma, nitrogen and helium.

In one embodiment, the atmosphere of the annealing process is a mixture of hydrogen and nitrogen, and the volume ratio of nitrogen and hydrogen ranges from about 15:1 to about 25:1.

In one embodiment, after forming the source region and the drain region, the method further includes forming a dielectric layer covering the gate electrode, forming a plurality of contact holes in the gate dielectric layer, forming a stop layer on a bottom surface and sidewalls of the plurality of contact holes, filling the contact holes with a metal layer, and planarizing the metal layer until a surface of the metal layer is flushed with the surface of the dielectric layer.

In one embodiment, the method described above further includes performing an in-situ annealing process after forming the stop layer.

Embodiments of the present invention can provide many benefits over conventional techniques. For example, embodiments of the present invention provide easy to use processes that rely upon conventional technology and solve problems of hot carrier injection. In some embodiments, the method for fabricating an NMOS transistor includes providing a substrate, forming a gate dielectric layer on the substrate, and forming a gate electrode on the gate dielectric layer. The method further includes performing a fluorine ion implantation in the semiconductor substrate below the gate dielectric layer either before or after forming source/drain regions and performing an annealing process in the substrate in an atmosphere comprising hydrogen or hydrogen plasma, so that fluorine ions and hydrogen ions are introduced to a contact surface between the gate dielectric layer and the substrate, surface states of the substrate under the gate dielectric layer are thus improved, hot carrier injection is effectively reduced or eliminated, and life of the integrated circuit is thus extended.

Furthermore, according to embodiments of the present invention, the fluorine ion implantation can be performed either before or after forming the source/drain extension regions, so that more flexibility in the semiconductor fabrication processes can be achieved.

Additionally, the method may perform an in-situ annealing process after forming a barrier layer in a contact hole, so that the fabrication process for an NMOS transistor can be simplified.

BRIEF DESCRIPTION OF THE DRAWINGS

The accompanying drawings, which are incorporated herein and form a part of the specification, and, together with the description, further serve to explain the principles of the embodiments of the invention and to enable a person skilled in the art to make and use the invention.

DETAILED DESCRIPTION OF THE INVENTION

The present invention, which in one embodiment provides a method for fabricating an NMOS transistor and solving the problem of hot carrier injection, will now be described by referring to the following discussion and drawings that accompany the present invention. It is noted that the drawings are provided for illustrative purposes only and, as such, they are not drawn to scale.

Figure 1:
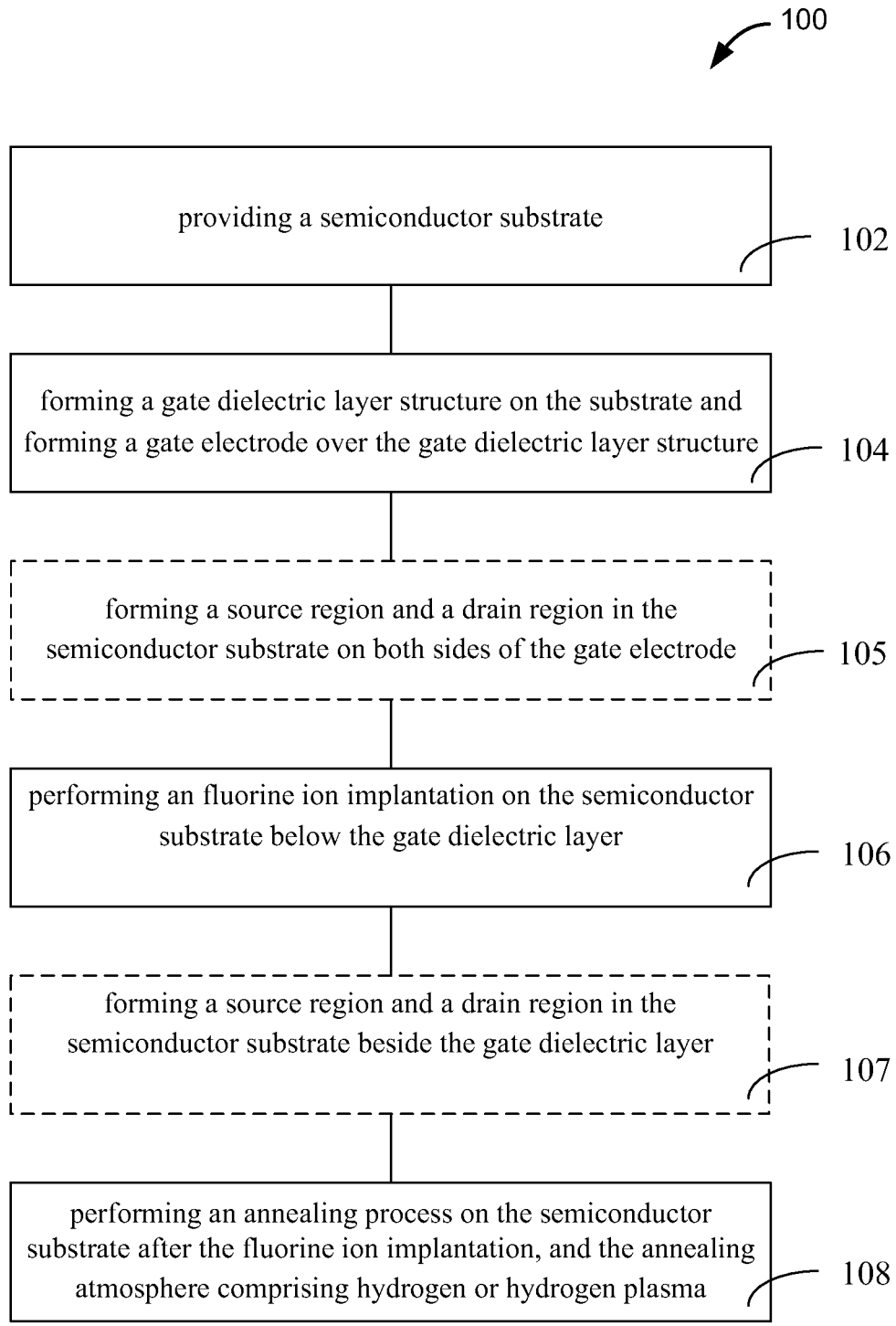
FIG. 1 illustrates a flow diagram of a method for fabricating an NMOS transistor according to one embodiment of the present invention.

FIG. 1 shows a process flow diagram of an embodiment of the present invention. Referring to FIG. 1, the method for fabricating an NMOS transistor includes providing a semiconductor substrate (102), forming a gate dielectric layer over the semiconductor substrate and forming a gate electrode over the gate dielectric layer structure (104), performing a fluorine ion implantation in the semiconductor substrate below the gate dielectric layer (106), and performing an annealing process in the semiconductor substrate in an atmosphere comprising hydrogen or hydrogen plasma (108).

FIG. 1 also shows forming a source region on a first side of the gate electrode and a drain region on a second side of the gate electrode. According to embodiments of the present invention, the source and drain regions can be formed before the fluorine ion implantation (105). In other embodiments, the source and drain regions can be formed after the fluorine ion implantation (107).

Figure 2:
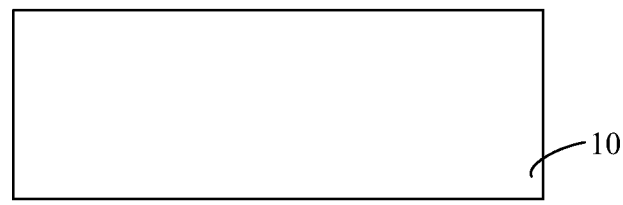
FIG. 2 to FIG. 10 are cross-sectional views illustrating a method for manufacturing an NMOS transistor according to an embodiment of the present invention.

As an example, the process described above can be use for fabricating an NMOS transistor. Referring now to FIG. 2, a starting substrate 10 is provided. Substrate 10 may be a single crystalline silicon, silicon-germanium compounds, or silicon on insulator (SOI) structure or silicon epitaxial layer structure. Optionally, semiconductor substrate 10 can be monocrystalline silicon.

Figure 3:
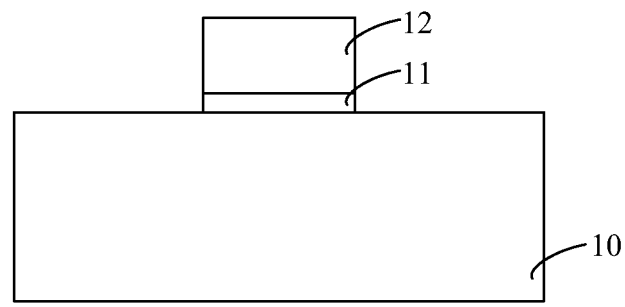

Referring to FIG. 3, a gate dielectric layer 11 is formed over the substrate 10 and a gate electrode 12 is formed over gate dielectric layer 11. In one embodiment, gate dielectric layer structure 11 may comprise silicon dioxide, gate electrode 12 may comprise polysilicon, and gate dielectric layer 11 and gate electrode 12 can be formed by CVD.

Figure 4:
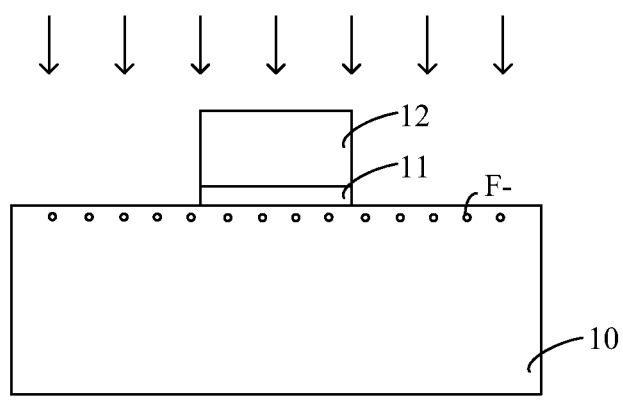

Referring to FIG. 4, substrate 10 is subjected to a fluorine ion implantation. In an embodiment, the ion used in the fluorine ion implantation can be fluorine (F) ion, the implantation energy ranges from about 2 KeV to about 20 KeV, and the implantation dosage ranges from about $1.0E+14$ atom/cm$^2$ to about $3.0E+15$ atom/cm$^2$. The fluorine ion is implanted through gate electrode 12 and gate dielectric layer structure 11 into semiconductor substrate 10.

Figure 5:
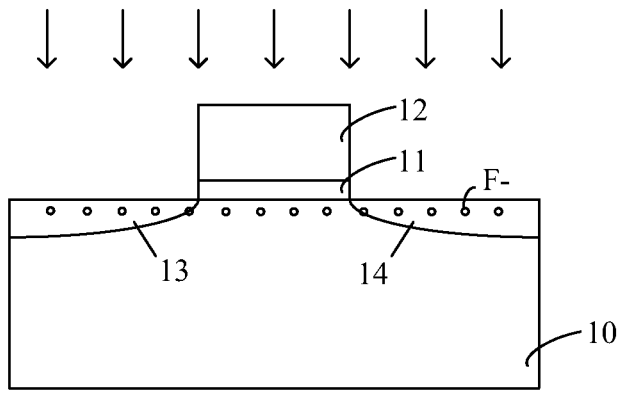
Figure 6:
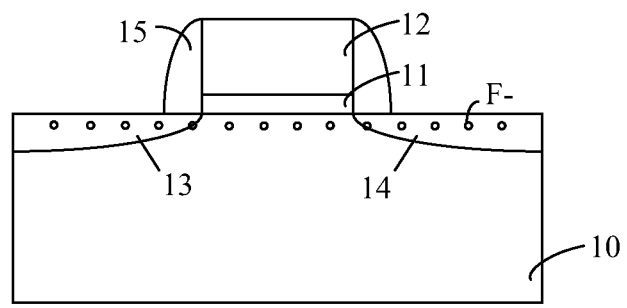
Figure 7:
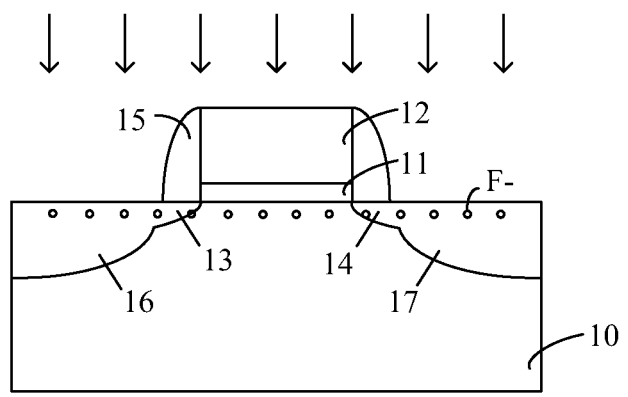

FIGS. 5 to 7 show that a source region 16 and a drain region 17 are formed in the semiconductor substrate 10 on each side of gate dielectric layer 11 and gate electrode 12 (corresponding to 105, 107 in FIG. 1).

Referring to FIG. 5, using gate electrode 12 as a mask, a first ion implantation is performed in semiconductor substrate 10 to form a source extension region 13 and a drain extension region 14 within semiconductor substrate 10 on each side of gate dielectric layer structure 11. The ions used in the first ion implantation can be n-type ions, such as phosphorus ions, arsenic ions, and the like. In an embodiment, before performing the first ion implantation, offset spacers may be formed on the sidewalls of gate dielectric layer structure 11 and gate electrode 12 for protecting gate dielectric layer 11 and gate electrode 12 from being affected by the first ion implantation. After the first ion implantation, a first activation annealing process may be performed in semiconductor substrate 10 to activate the ions implanted.

Referring to FIG. 6, spacers 15 are formed on sidewalls of gate dielectric layer 11 and gate electrode 12. In one embodiment, the spacers 15 may comprise silicon oxide, silicon nitride, or a stack structure of silicon oxide and silicon nitride.

Referring to FIG. 7, using gate electrode 12 and spacers 15 as a mask, a second ion implantation is performed in semiconductor substrate 10 to form a source region 16 and a drain region 17 on each side of gate dielectric layer 11, gate electrode 12 and spacers 15. The conduction type of the second ion implantation can be the same as the first ion implantation, namely n-type, such as phosphorus ions, arsenic ions, and the like. The ions used in the second ion implantation may be the same as or different from the ions used in the first ion implantation. In an embodiment, the dosage of ions in the second ion implantation is higher than the dosage of ions in the first ion implantation by 1 to 2 orders of magnitude. After the second ion implantation, a second activation annealing process may be performed in semiconductor substrate 10 to activate the ions implanted.

In some embodiments, the F ion implantation can be performed before forming the source extension region 13 and the drain extension region 14 by the first ion implantation. In other embodiments, the fluorine ion implantation may be performed after the first ion implantation and before forming spacers 15. In some embodiments, the fluorine ion implantation may be performed after forming spacers 15 and before the second ion implantation. In other embodiments, the fluorine ion implantation may be performed after forming source region 16 and drain region 17 by the second ion implantation.

Figure 8:
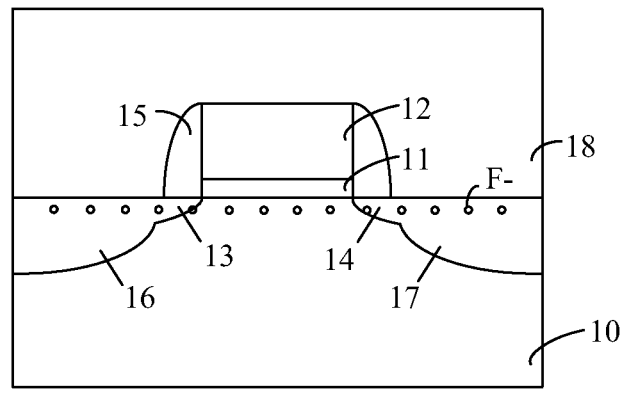

Referring to FIG. 8, after forming source region 16 and drain region 17, a dielectric layer 18 is formed covering a surface of gate electrode 12, spacers 15 and exposed surfaces of semiconductor substrate 10. In one embodiment, dielectric layer 18 can comprise silicon oxide or doped silica glass, such as phosphorous silica glass (PSG), boron phosphorus silicon glass (BPSG), and the like. Dielectric layer 18 can be formed by Chemical Vapor Deposition, Plasma Enhanced Chemical Vapor Deposition, and the like. It should be noted that before forming dielectric layer 18, a PMOS transistor may be formed side by side with the NMOS transistor on the semiconductor substrate 10 for forming a CMOS structure.

Figure 9:
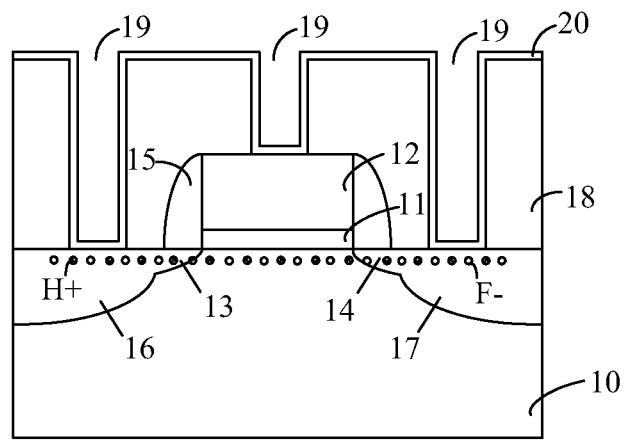

Referring to FIG. 9, one or more contact holes 19 are formed in dielectric layer 18. The bottom of contact holes 19 exposes one or more of source region 16, drain region 17 and gate electrode 12. In one embodiment, the method for forming contact holes 19 includes forming a photoresist layer on the surface of dielectric layer 18, pattering the photoresist layer, and etching dielectric layer 18 using the patterned photoresist layer as a mask. The etching process can be an anisotropic dry etching process.

Still referring to FIG. 9, a stop layer 20 is formed on the bottom and sidewalls of contact holes 19. In one embodiment, the material of stop layer 20 may be Ti, TiN, and the like. Stop layer 20 is formed using Chemical Vapor Deposition, Physical Vapor Deposition, and the like.

After forming stop layer 20, substrate 10 is subjected to an in-situ annealing process. In one embodiment, the in-situ annealing process can be performed in a reaction chamber where the stop layer is formed. The annealing atmosphere may comprise hydrogen or hydrogen plasma. The annealing temperature ranges from about 350° C. to about 550° C. and the time period for annealing ranges from about 20 minutes to about 60 minutes. After the in-situ annealing process, hydrogen ions are introduces into the contact interface of the semiconductor substrate 10 and gate dielectric layer 11.

In one embodiment, the annealing atmosphere may be a mixture of hydrogen and nitrogen, a mixture of hydrogen and argon, a mixture of hydrogen and helium, a mixture of hydrogen, nitrogen, and argon, a mixture of hydrogen, nitrogen, and helium, a mixture of hydrogen plasma and nitrogen, a mixture of hydrogen plasma and argon, a mixture of hydrogen plasma and helium, a mixture of hydrogen plasma, nitrogen and argon, or a mixture of hydrogen plasma, nitrogen and helium. In another embodiment, the annealing atmosphere is a mixture of hydrogen and nitrogen, and the volume ratio of nitrogen and hydrogen ranges from about 15:1 to about 25:1.

The inventors have discovered through researches and experimentations that fluorine ions and hydrogen ions both are introduced into the contact interface of gate dielectric layer 11 and semiconductor substrate 10 through fluorine ions implantation. The annealing process in an atmosphere comprising hydrogen or hydrogen plasma improves the surface state of substrate 10 under gate dielectric layer 11, so that high-speed electrons into gate dielectric layer 11 can be avoided, and HCI problems are thus reduced or eliminated and life of a device is extended. In addition, the annealing process using hydrogen or hydrogen plasma improves the diffusion of fluorine ions implanted in substrate 10 below gate dielectric layer 11, so that the fluorine ions are uniformly distributed in the contact area of gate dielectric layer structure 11 and substrate 10, and the surface state of substrate 10 is further improved.

Figure 10:
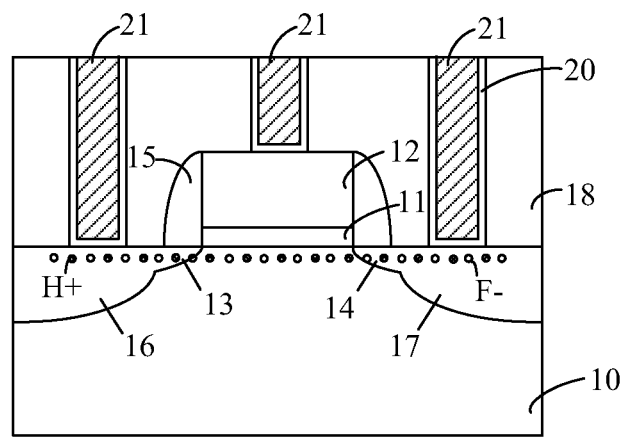

Referring to FIG. 10, contact holes 19 are filled with a metal layer 21, and the metal layer 21 is planarized to remove stop layer 20 and metal layer 21 on the surface of dielectric layer 18, so that the polarized surface of metal layer 21 in the contact holes is flushed (co-planar) with the top surface of dielectric layer 18.

In embodiments described above, before or after forming the source region and the drain region, or before or after forming the source extension region and the drain extension region, fluorine ions are implanted in the substrate that is subjected to an annealing process. In embodiments described above, the annealing process may be the first activation annealing process, the second activation annealing process, or the in-situ annealing process. In an embodiment, the annealing atmosphere includes hydrogen or hydrogen plasma, so that the surface state of the contact area of the substrate and the gate dielectric layer can be significantly improved, the hot carrier injection can be suppressed and the life of the device can be extended.

It should be noted that in other embodiments, the source extension region and the drain extension region are not formed, and the source region and the drain region are formed in the substrate on each side of the gate dielectric layer after forming the gate dielectric layer and the gate electrode. The fluorine ions implantation and the annealing process can be performed in the substrate before or after forming the source region and the drain region. In an embodiment, the annealing atmosphere comprises hydrogen or hydrogen plasma.

Although the present invention has been disclosed above with reference to preferred embodiments thereof, it should be understood that the invention is presented by way of example only, and not limitation. Those skilled in the art can modify and vary the embodiments without departing from the spirit and scope of the present invention.

What is claimed is:

1. A method for fabricating an NMOS transistor, comprising:
   providing a substrate;
   forming a gate dielectric layer on the substrate;
   forming a gate electrode on the gate dielectric layer;
   after the gate electrode is formed, performing a fluorine ion implantation to the substrate at least below the gate dielectric layer; and
   performing an annealing process in the substrate after the fluorine ion implantation in an atmosphere comprising hydrogen or hydrogen plasma, such that fluorine ions and hydrogen ions are introduced to at least a channel region under the gate electrode;
   forming a dielectric layer covering the gate electrode;
   forming one or more contact holes in the dielectric layer;
   forming a stop layer on a bottom surface and sidewalls of the one or more contact holes;
   filling the one or more contact holes with a metal layer;
   planarizing the metal layer until a surface of the metal layer is flushed with a surface of the dielectric layer; and
   performing an annealing process after forming the stop layer.

2. The method of claim 1, wherein an energy of the fluorine on implantation ranges from about 2 KeV to about 20 KeV.

3. The method of claim 1, wherein a dosage of the fluorine on implantation ranges from about 1E14 atom/cm$^2$ to about 3E15 atom/cm$^2$.

4. The method of claim 1 further comprising forming a source region on a first side of the gate electrode and a drain region on a second side of the gate electrode.

5. The method of claim 4 further comprising forming the source and drain regions before the fluorine ion implantation.

6. The method of claim 4 further comprising forming the source and drain regions after the fluorine on implantation.

7. The method of claim 4, wherein forming a source region and a drain region comprises: performing a first ion implantation in the substrate using the gate electrode as a mask to form a source extension region and a drain extension region;

forming spacers on sidewalls of the gate dielectric layer and the gate electrode; and performing a second ion implantation in the substrate using the spacers and the gate electrode as a mask to form the source region and the drain region.

8. The method of claim 7, wherein the fluorine ion implantation is performed before the first on implantation.

9. The method of claim 7, wherein the fluorine on implantation is performed after the first ion implantation and before forming the spacers.

10. The method of claim 7, wherein the fluorine on implantation is performed after forming the spacers and before the second ion implantation.

11. The method of claim 7, wherein the fluorine on implantation is performed after the second ion implantation.

12. The method of claim 7 further comprising performing a first activation annealing process in the substrate after the first ion implantation to activate implanted ions.

13. The method of claim 7 further comprising performing a second activation annealing process in the substrate after the second ion implantation to activate implanted ions.

14. The method of claim 1, wherein a temperature of the annealing process ranges from about 350° C. to 550° C.

15. The method of claim 14, wherein a time period of the annealing process ranges from about 20 minutes to about 60 minutes.

16. The method of claim 1, wherein the atmosphere of the annealing process is a mixture of hydrogen and nitrogen, a mixture of hydrogen and argon, a mixture of hydrogen and helium, a mixture of hydrogen, nitrogen and argon, a mixture of hydrogen, nitrogen and helium, a mixture of hydrogen plasma and nitrogen, a mixture of hydrogen plasma and argon, a mixture of hydrogen plasma and helium, a mixture of hydrogen plasma, nitrogen and argon, or a mixture of hydrogen plasma, nitrogen and helium.

17. The method of claim 1, wherein the atmosphere of the annealing process is a mixture of hydrogen and nitrogen, and the volume ratio of nitrogen and hydrogen ranges from about 15:1 to about 25:1.

18. The method of claim 1, wherein the annealing process performed after forming the stop layer comprises an in-situ annealing process.

* * * * *